United States Patent [19]
Blaauw et al.

[11] Patent Number: 5,619,418
[45] Date of Patent: Apr. 8, 1997

[54] LOGIC GATE SIZE OPTIMIZATION PROCESS FOR AN INTEGRATED CIRCUIT WHEREBY CIRCUIT SPEED IS IMPROVED WHILE CIRCUIT AREA IS OPTIMIZED

[75] Inventors: David T. Blaauw; Joseph W. Norton; Larry G. Jones, all of Austin, Tex.; Susanta Misra, Bangalore, India; R. Iris Bahar, Boulder, Colo.

[73] Assignee: Motorola, Inc., Schaumburg, Ill.

[21] Appl. No.: 390,210

[22] Filed: Feb. 16, 1995

[51] Int. Cl.[6] .................................................. G06F 17/50
[52] U.S. Cl. ........................... 364/489; 364/488; 364/490
[58] Field of Search ..................................... 364/488, 489, 364/490, 491, 578; 437/250

[56] References Cited

U.S. PATENT DOCUMENTS

| | | | |
|---|---|---|---|
| 4,827,427 | 5/1989 | Dunlop et al. | 364/491 |
| 5,003,487 | 3/1991 | Drumm et al. | 364/489 |
| 5,031,111 | 7/1991 | Chao et al. | 364/491 |
| 5,095,441 | 3/1992 | Hopper et al. | 364/489 |
| 5,402,356 | 3/1995 | Schaefer et al. | 364/489 |
| 5,406,497 | 4/1995 | Altheimer et al. | 364/489 |
| 5,422,317 | 6/1995 | Hua et al. | 437/250 |
| 5,426,591 | 6/1995 | Ginetti et al. | 364/489 |
| 5,459,673 | 10/1995 | Carmean et al. | 364/489 |
| 5,475,607 | 12/1995 | Apte et al. | 364/489 |
| 5,500,808 | 3/1996 | Wang | 364/578 |
| 5,510,999 | 4/1996 | Lee et al. | 364/491 |
| 5,526,277 | 6/1996 | Dangelo et al. | 364/489 |

OTHER PUBLICATIONS

"Experiments Using Automatic Physical Design Techniques for Optimizing Circuit Performance," Dunlop et al; 1990 IEEE, pp. 216–220.

"Computing the Entire Active Area Versus Delay Trade–Off Curve for Gate Sizing with a Piecewise Linear Simulator," Buurman et al.

"Optimization–Based Transistor Sizing," Shyu et al; IEEE 1987 Custom Integrated Circuits Conference, pp 417–420.

Primary Examiner—Kevin J. Teska
Assistant Examiner—Russell W. Frejd
Attorney, Agent, or Firm—Keith E. Witek

[57] ABSTRACT

An integrated circuit, when designed, must adhere to timing constraints while attempting to minimize circuit area. In order to adhere to timing specifications while arriving at a near-optimal circuit surface area, an iterative process is used which selectively increases logic gates sizes by accessing logic gates from a memory stored logic gate library. A circuit representation is read along with timing constraints for circuit paths. Each circuit path in the circuit is processed to find it's actual circuit path delay. A most out-of-specification circuit path (in terms of speed) is chosen in the circuit and a sensitivity calculation is performed for each logic gate in the most out-of-specification circuit path. The logic gate in the circuit path with the maximized sensitivity (sensitivity= $\Delta$speed/$\Delta$area) is increased in size by accessing a larger gate in the library in order to improve speed at the expense of area. The above process continues iteratively until no out-of-specification circuit paths are found.

29 Claims, 6 Drawing Sheets

LOGIC GATE SIZE OPTIMIZATION PROCESS FOR AN INTEGRATED CIRCUIT WHEREBY CIRCUIT SPEED IS IMPROVED WHILE CIRCUIT AREA IS OPTIMIZED

FIELD OF THE INVENTION

The present invention relates generally to design of data processing systems, and more particularly, to efficiently designing integrated circuits to adhere to circuit timing constraints.

BACKGROUND OF THE INVENTION

The design of integrated circuits in a time-efficient and cost-effective manner is critical to the integrated circuit (IC) industry. An integrated circuit needs to be small or have a dense packing density in order to produce more ICs per wafer and maximize profits. Unfortunately, a dense integrated circuit is designed with small transistors. These small transistors have small aspect ratios which result in slow switching speeds and propagation speeds of signals in the dense circuit. Therefore, the area of a circuit is traded off for speed. It is important to use a design process wherein specified or required speed constraints are met while size is not grossly impacted. In addition, this design process should be quick and easy to use.

Most of the methods for attaining speed critical circuits at a minimal circuit surface area use a custom design process. In a custom design process no library-stored gates are used. If a logic gate is required for a design, all of these logic gates are formed with the same default logic gate. For example, all ORs in an initial design are all the same logic gate size, strength, etc.. A program or designer then automatically/manually changes specific sizes of specific transistors along circuits paths in order to arrive at required circuit speeds. Since individual transistors are increased in size (which is the smallest circuit element in the design), a very small area (near optimal area) is achieved while speed constraints are adhered to. The problem is that each gate may be different from all others in that each transistor in the circuit is subject to size changes independent of what gate the transistor belongs to. Therefore, the changing of transistor sizes in a random and non-uniform manner to the gates results in all or many OR gates now being radically different from one another. This makes integration difficult and makes layout a nearly all-manual task. No gates can be stored and read from a library and the speed and efficiency of semi-custom design flow process is lost.

A process and apparatus is needed to improve circuit speed while arriving at a near-optimal area. This process and apparatus needs to be compatibility to a semi-custom design flow which uses library defined gates in order to maintain short time to market, easier layout processing, and efficiency, while attaining the benefits of the optimized speed at an optimal area.

DESCRIPTION OF A PREFERRED EMBODIMENT

Figure 1:
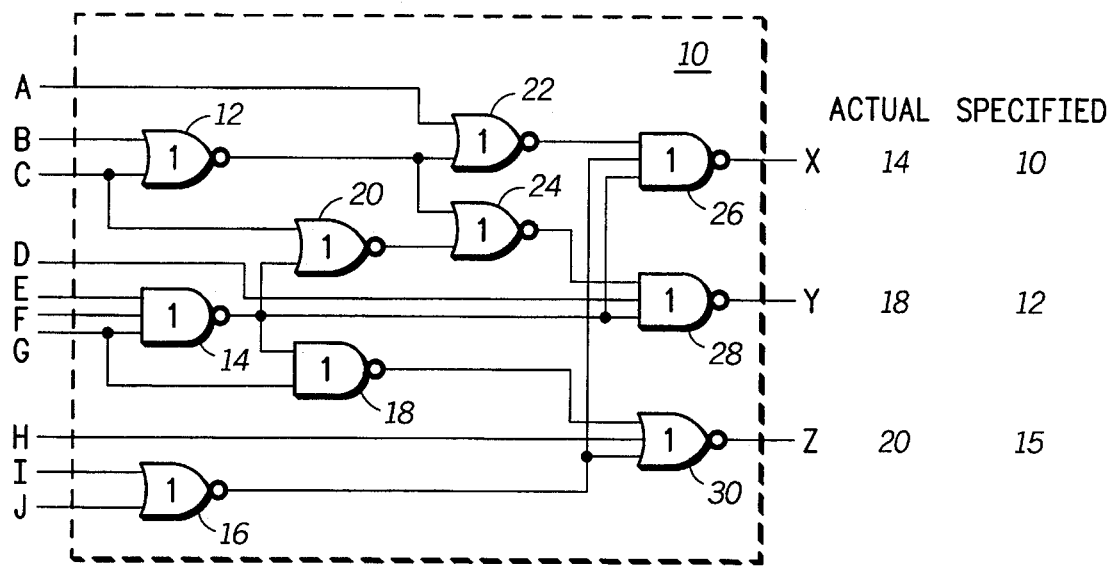
FIGS. 1–9 illustrate, in circuit diagrams, a circuit designed and iteratively processed by the method of FIG. 10 to allow all circuit paths in the circuit to adhere to specified/required timing constraints at the expense of circuit area, the iterative processing being in accordance with the present invention.

Generally, the present invention is a method and apparatus for sizing logic gates in a circuit design stored in memory. The sizing is done to allow one or more circuits or circuit paths to be reduced in signal propagation delay until specified circuit speed values are attained (i.e., sizing of logic gates is increased until the part performs within specified timing constraints).

In the past, custom physical design was performed wherein gates and/or individual transistors were sized individually by engineers in order to optimize circuit path delay times. This technique gave high performance and low power consumption, but also resulted in a long time to market, resulted in a difficult circuit which was nearly impossible to modify and control, and poor integration with computer aided design (CAD) tools. Using custom design techniques, the fast library logic gate access techniques used today could not be used since each gate needed custom sizing and could not be pre-stored in a predetermined format.

The method and apparatus taught herein uses semi-custom physical design flow to design circuits. Semi-custom physical design is performed by selecting logic gates from a library, wherein the logic gates within the library vary in drive strength and other parameters. An automated processing of designing a circuit and selecting gate sizes to conform to specified speeds is taught herein. The gate sizes are iteratively increased in small quantum steps by iteratively reading larger gates from the library to replace smaller gates until the specified timing constraints are met. This iterative semi-custom technique is improved over custom physical design processes since the cycle time or time to market is reduced and rapid modification and understanding of the circuits can be achieved. In addition, by iteratively increasing the gate sizes and only increasing by small quantum amounts in each iterations until all timing is satisfied guarantees that, while speed is met, the circuit still has a near-optimally small surface area for packing density reasons. In other words, the iterative process ensures that timing constraints are just met and not overcompensated for at the expense of huge logic gates which take up too much substrate surface area.

In general, the method begins by receiving a circuit description file. The circuit description file comprises a plurality of gates having at least one input and at least one output. The outputs and inputs of the plurality of gates are interconnected via conductors to form several circuits paths wherein a circuit path is a conductive path through one or more gates which propagates input signals through the logic gates to eventually, after some propagation delay, arrive at one or more outputs. Initially, the strength of the plurality of gates in the circuit are set to minimum or smaller-than-maximum strengths, thereby initially allowing minimal circuit area and improved packing density in an integrated circuit. By setting the gates to a minimal strength, area is optimized to a best-case area, but timing or circuit speed path delay times are not optimized and usually not within specified speed constraints. In general, a faster circuit includes larger logic gates having transistors with larger aspect ratios whereas slower circuits contain smaller logic gates having transistors with smaller aspect rations.

After receipt of a data file which identifies the gates and their interconnection, timing data which indicates the required circuit speeds of the circuit paths is received in order to improve circuit speed at the expense of circuit area. The actual circuit speeds, given that the gates are set to a minimum strength/size, are calculated and compared to the specified timing data. The method then iteratively processes each circuit path in the circuit, increasing gate sizes in order to reduce actual circuit delay times until all circuit paths are within specified circuit delay times.

For example, in one circuit, there may be 10 circuit paths. A library of gates is accessed to read individual gates which are used to make up the gates in the circuit. The library will contain one or more of AND, OR, NOR, NAND, inverters, buffers, transfer gates, flip-flops, multiplexers, counters, latches, and the like, in many formats (i.e., two-input and three-input). In addition, all categories of logic gates are stored in an array of several sizes. For example, two-input OR gates may be stored in the library in 8 different strengths numbered 1–8, and therefore have 8 different speeds and substrate surface areas from which the iterative processing above may choose. First, the circuit path which is most out of specification in terms of timing is chosen and a gate along that path is increased in strength by choosing a next greater strength from the library. For example, assume that the path #6 has the most-out-of-specification time and a two-input OR gate of size 1 in that path is determined to be the best gate to increase is size to get the best overall speed improvement. Then this OR gate is increased one size to size 2 and the worst case path in the circuit is found again. Another gate is increased in this iterative manner until all circuit paths are within specification. The change in size of one gate may affect multiple circuit paths. Only one gate per worst circuit path, is increased at a time in order to arrive at an optimal point wherein the speed specifications are adhered to while area is minimized to a near-optimal substrate area.

The gate, which is within the worst circuit path and chosen for increase in size, is determined/identified by a calculation (similar to a difference equation or differential equation) which computes the ratio of change in speed reduction obtained to the increase in area obtained. The gate that has the maximum ratio (i.e., has the greatest speed difference for the smallest increase in area) is chosen for increase. This iterative process continues for all circuit paths until the specified circuit timing is adhered to. Therefore, the method discussed below in general follows the following steps:

1) read a circuit data file and set gates to a minimum or small area.
2) read the specification timing that is required.
3) calculate the timing of the circuit with the current gate strengths/sizes.
3) find the most-out-of-specification circuit path in the circuit.
4) find the gate along the circuit path which gives the most reduction is speed for the least increase in surface area.
5) increase the size of this gate to reduce speed at the expense of circuit area.
6) repeat steps 3–6 until no circuit paths are out-of-specification.

The method and apparatus discussed above may be further understood with reference to FIGS. 1–10.

FIG. 1 illustrates a circuit 10. Before describing the circuit 10, it is important to understand how circuit 10 is defined via statements in memory. The method and apparatus taught herein reads from memory a series of computer instructions or computer assignment statements similar to that illustrated below in Table 1.

TABLE 1

| module | Example (a, b, c, d, e, f, g, h, i, j, x, y, z); |
|---|---|
| input | a; |
| input | b; |
| input | c; |
| input | d; |
| input | e; |
| input | f; |
| input | g; |
| input | h; |
| input | i; |
| input | j; |
| output | x; |
| output | y; |
| output | z; |
| wire | x; |
| wire | y; |
| wire | z; |
| assign | |
| x = ((a | (b | c)')' & (i |j)'' & (e & f & g)')', | |
| y = ((e & f & g)' & d & ((b | c)' | (c | (e & f & g)'))')', | |
| z = ((g & (e & f & g)')' | h | (i | j)')'; | |
| endmodule | |

When an engineer or circuit designer is designing a product, that engineer or circuit designer uses a computer instruction syntax as illustrated in Table 1 to describe logical operations. Table 1 illustrates a circuit module called "example" which has several inputs labeled A–J and three outputs labeled X–Z. In the "assign" section of Table 1, the outputs X, Y and Z are each defined in terms of the inputs A–J and logical relationships. | is an OR operation, & is an and operation and (X)' means that the value X is inverted in a NOR or NAND manner. The method and apparatus accepts this computer file from Table 1 as input from a memory storage device. The information read from memory and illustrated in Table 1 is processed by a central processing unit (CPU) to arrive at a circuit representation illustrated below in Table 2 (this is also stored in memory).

TABLE 2

```
module Example (a, b, c, d, e, f, g, h, i, j, x, y, z);
input a, b, c, d, e, f, g; h, i, j,
output x, y, z;
    nor2 U1 {.b, .c, .out(n1)};
    nand3 U2 {.e, .f, .g, .out(n2)};
    nor2 U3{.i, .j, .out(n3)};
    nand2 U4 {.g, .n2, .out(n4)};
    or2 U5 {.n2, .c, out(n5)};
    nor2 U6 {.n5, .n1, .out(n6)};
    nor2 U7 {.a, .n1, .out(n7)};
    nand3 U8 {.n7, .n3, .n2, .out(x)};
    nand3 U9 {.n6, .d, .n2, .out(y)};
    nor3 U10 {.n3, .n4, .h, out(z)};
endmodule
```

Table 1 contains three assignment statements, one for X, one for Y and one for Z. These assignment statements indicate the logic values of X, Y & Z given the inputs A–J, but do not describe physical circuit structure using physical/library gates. Table 2 transforms the assignment statements of Table 1 to a physical representation or physical diagram format which performs the functions or assignments illustrated in Table 1. Table 2 has the same number of inputs and outputs as Table 1, but instead of characterizing the circuit as assignment statements Table 2 characterizes the circuit as a plurality of logic gates which perform an operation as described by the information in table 1. Table 2 illustrates 10 logic gates labeled U1–U10. These logic gates are illustrated in FIG. 1. Table 3 below identifies which gate in Table 2 corresponds to which gate in FIG. 1.

TABLE 3

| Table 2 label | Numerical gate label in FIG. 1 |
| --- | --- |
| U1 | gate 12 |
| U2 | gate 14 |
| U3 | gate 16 |
| U4 | gate 18 |
| U5 | gate 20 |
| U6 | gate 22 |
| U7 | gate 24 |
| U8 | gate 26 |
| U9 | gate 28 |
| U10 | gate 30 |

Circuit 10 of FIG. 1 (both gates and interconnections of gates) is syntactically defined via the computer code illustrated in Table 2.

The information from Table 2 may be graphically illustrated as depicted in FIG. 1. FIG. 1 illustrates 10 gates labeled gate 12 through gate 30. These gates comprise one or more of a NOR-gate and NAND-gate and an OR-gate although any logic gate may be used for circuitry herein. The inputs A–J are illustrated in FIG. 1 along with the outputs X–Z.

In addition to reading as input the information from Table 2 and Table 1, the method reads as input specified timing constraints illustrated in FIG. 1 under a heading entitled "Specified". The data listed under the heading "Specified" is a unitless measurement of time, but can be indicated in any measurement of time known in the art (like picoseconds, nanoseconds, etc.). In FIG. 1, the specified time for output X is 10, the specified time for output Y is 12, and the specified time for output Z is 15. Therefore, a circuit designer has indicated that in order to operate properly the output signal provided via X must be stable and logically proper 10 units of time after the inputs A–J are applied. In a like manner, Y must be valid 12 units of time after the inputs are provided, and Z must be valid 15 units of time after the inputs A–J are provided.

In FIG. 1, the actual time delay between application of the inputs and stabilization of the outputs are listed in a column entitled "Actual". All of the gates in circuit 10 are set to a minimum size which is indicated as size one (size '1') inside each of the logic gates of FIG. 1. This sizing to a minimal size gives the best area possible for circuit 10, but results in the slowest transition times from inputs to outputs. Therefore, with the smallest surface area and minimal gate size in FIG. 1 the actual times for X, Y and Z, which are respectively 14, 18 and 20, do not conform to the specified timing values of 10, 12 and 15. Therefore, an iterative process is used to increase area of gates selectively in order to reduce the actual time delays from inputs to outputs until the actual times are within (less than or equal to) the specified values.

In FIG. 1, several circuit paths are illustrated. For example, a circuit path exists between the input A, through gate 22, through 26, to output X. Another circuit path exists between input E, through gate 14, through gate 28 to output Y. Given the two circuit paths provided above. It is easy to see that there are several circuit paths illustrated in FIG. 1.

The increasing of the gate sizes in order to obtain the specified time delays performed in an iterative manner. The iteration is as follows. The output value, which is most out of spec. is chosen from FIG. 1. This selection may be done by subtracting the actual timing values from FIG. 1 with the specified timing values in FIG. 1 and choosing the output which has the largest or greatest difference value. If this method is chosen, then the output Y is the worst output in terms of timing constraints since 18 minus 12 is equal to 6 and is the large difference in FIG. 1. Other techniques such as percentage of difference between actual and specified may be used to replace the delta/difference method of determining the worst circuit path taught above.

Once the most-out-of-specification output is determined, which in this case is Y, the circuit path which affects Y and has the largest time delay is identified. In FIG. 1, the worst case path which slows Y the most is a path from either input E to the output Y. Once the specific worst case output and specific worst-case circuit path connected to the output is determined, this worst-case circuit path Y is then analyzed on a gate-by-gate basis. The gates which affect Y along all circuit paths between input E and output Y are gates 14, 20, 24 and 28. For each of these gates, a sensitivity calculation is performed in order to determine the gate which is to be increased in size. The gate is increased in size by choosing the next largest gate out of the library which has the same logic function. The gate which maximizes $\Delta S/\Delta A$ (reduction in speed divided by added area due to increase in size) is increased in size by accessing the library.

One specific method for calculating the delay sensitivity of logic gates comprising multiple transistors is described below. For each logic gate in the worst circuit path, a total delay sensitivity is calculated. The sensitivity is defined as the ratio of time delay change ($\Delta S$) over the change in the total transistor size of the logic gate ($\Delta A$) for infinitely small size changes (i.e., $\Delta S/\Delta A$). In essence, this is the derivative of the delay of the logic gate with respect to the logic gate's transistor size or surface area. The logic gate delay sensitivity calculation for each gate in the worst logic gate path is then used to reduce the actual time of the worst output value to make it closer to, equal to, or less than the specified time. The gate with the largest sensitivity is incremented in size by selecting the next largest drive strength gate for it's type out of a library of gates in memory.

For example, a library may contain a 3 input AND logic gate type (AND3) and a 2 input OR logic gate type (OR2). Usually tens or hundreds of gate types are stored in one or more libraries, but only two are described here for ease of illustration. For each of these gates, AND3 and OR2, several different layouts are stored in memory wherein each layout has a different drive strength or physical size. The AND3 gates may have 20 different sizes and referred to as AND3-1 through AND3-20 whereas the OR2 gates have 15 different drive strengths or sizes referred to as OR2-1 through OR2-15.

Assume that the gate identified above which had the best sensitivity (greatest sensitivity) was an OR2-1 (the smallest OR gate possible). This gate, since it is the gate with the largest sensitivity and affects the delay time of the worst-case path, is increased in size by accessing the library and making the OR2-1 gate an OR2-2 gate. In all optimal cases, only one gate is incremented per iteration and that gate is only incremented only by one quantum size. Therefore, in other cases, the gate with the best sensitivity will be an AND3-12 and will be incremented to an AND3-13 to increase area in order to decrease delay times.

In order to find the sensitivity for each gate affecting the worst-timed path, the following is calculated:

Sensitivity=D'(W) where D(W) is the delay contributed to a circuit path by the element/gate as a function of the total transistor size of the element.

We can show that:

$$D'_i(w) = \text{sum}(d'_i(w) * r_i) \qquad \text{(Eq. 1)}$$

where: i=0 to n and i indicates by index each transistor used to make up the logic gate being analyzed (for example, a two input NOR usually requires four gates, a three input NAND usually requires 6 gates etc.).

$d_i(w)$ is the delay contributed to a circuit path by the i-th transistor as a function of it transistor size.

$r_i$ is the ratio of the size change of the transistor relative to the total size change of the element/gate.

and n is the number of transistors in the element/gate.

The method for finding the sensitivities is as follows:

Step 1: Given a path (or partial path) through a circuit, determine for the considered element the input and output nodes of the element that are on this circuit, path (referred to as element input and element output).

Step 2: Determine the critical path in the element/gate, consisting of nodes and transistors, that connects the power supply to the output such that it is controlled by the element input and produces the longest delay from the element input to the element output.

Step 3: Given the critical path through the element/gate, determine the transistor sensitivity of each transistor (d'(w)).

Step 4: For all transistors in the element/gate calculate the size ratio, defined as the ratio of the change in the transistor size, relative to the change in the total element size.

Step 5: For all transistors in the element/gate, calculate the sum of the transistor sensitivities weighted by their size ratios. The results is the sensitivity of the element/gate.

In general, sensitivity for individual transistors which are summed in Eq. 1 above are found by employing a Timed Logic Synthesizer (TILOS) method described in a paper entitled "Optimization-Based Transistor Sizing", by Shyu et al., 1987 IEEE Custom Integrated circuit Conference, beginning at page 417. Any sensitivity method for find the ratio of ΔS/ΔA for a transistor may be used herein.

Figure 2:
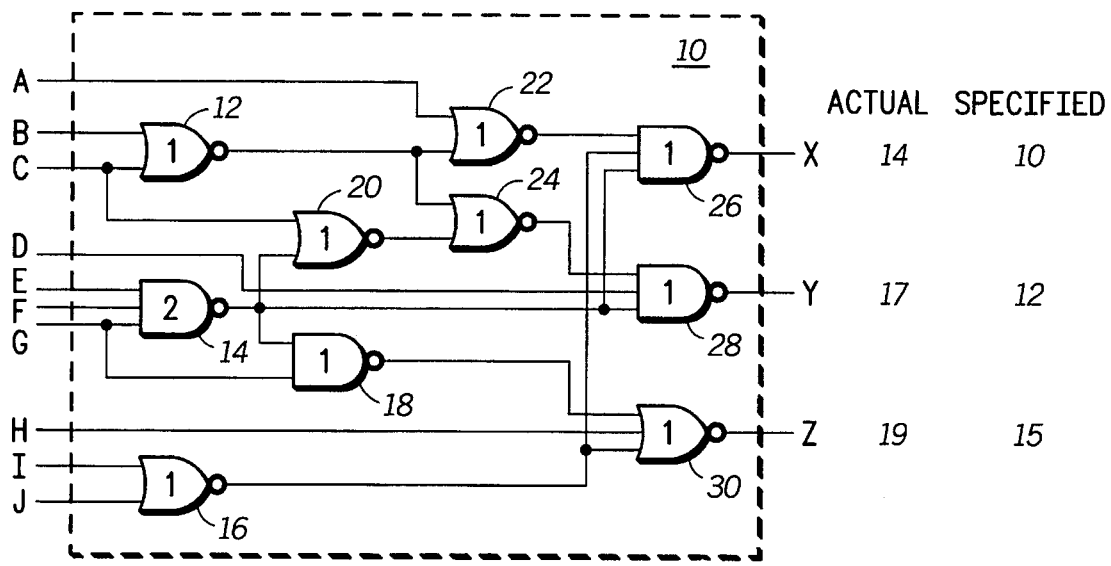

In FIG. 1, it is determined that out of the gates 14, 20, 24 and 28, gate 14 has the best sensitivity and is incremented in size as illustrated in FIG. 2. The size of gate 14 is incremented one quantum step from NAND-1 to NAND-2 (with three inputs). FIG. 1 affects both Y and Z. Some gates may reduce the times of many outputs whereas other gates will only affect one output.

Figure 3:
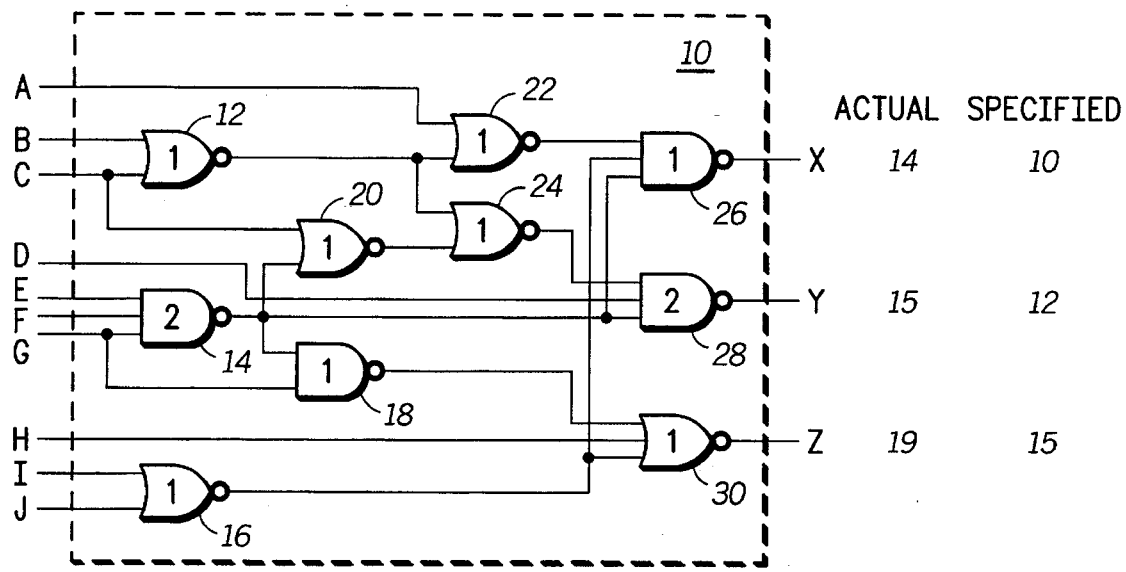

In FIG. 2, another iteration is performed where a new worst-case path and output is determined. In FIG. 2, output Y is still the worst-case output since 17−12=5 and is larger than the differences of X and Z which respectively are 4 and 4. In FIG. 2, it is determined that the gate 28 has the best sensitivity in this iteration and NOR gate 28 is incremented in size from NOR-1 to NOR-2 (with three-inputs). This increment in size is illustrated in FIG. 3. The increment in gate 28 reduced output Y's actual time from 17 units to 15 units which is closer to the required 12 units of time.

Figure 4:
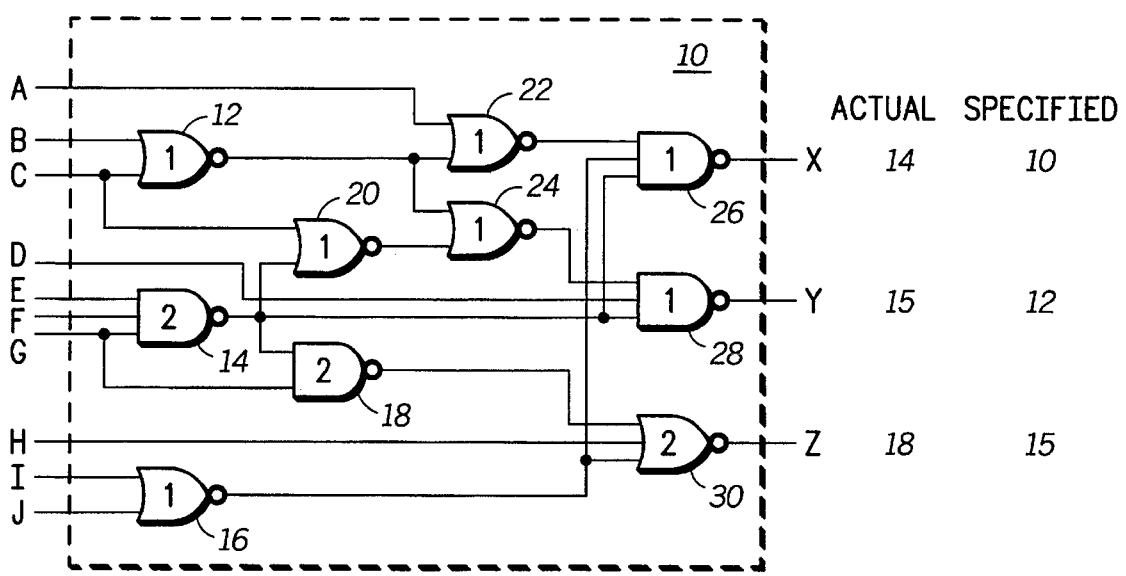

In FIG. 3, X has an actual timing to specified timing difference of 4, and Z has an actual to specified timing difference of 4. Therefore, one of either X or Z may be the worst case path for the third iteration. Any method may be used to choose between X and Z, and Z is chosen as the worst case path in FIG. 3 in a random manner. The worst case path in FIG. 3 is a circuit path from the input E through gate 14, through gate 18, through gate 30, to output Z. The sensitivity calculations taught herein are performed for the gates 14, 18 and 30 which reside along the circuit path in question. From these calculations, it is determined that gate 18 has the largest sensitivity. Therefore, gate 18 in FIG. 4 is incremented from a size 1 to a size 2 two-input NOR-gate. The actual time of the Z output is reduced from 19 to 18 via the incrementing in size of the gate 18 illustrated in FIG. 4.

In FIG. 4, the path X to the inputs B or C is determined to be the worst case path. Along this worst case path lies the gates 12, 22, and 26. By performing the sensitivity calculations taught herein, it is determined that gate 12 is the best gate to increase in size in order to reduce the actual speed delay of output X. Therefore, in FIG. 5, gate 12 is illustrated as being incremented from a size 1 two-input NOR-gate to size 2 two-input NOR-gate. The incrementing of the size of gate 12 not only affects the timing of output X, but affects the timing of output Y as illustrated in FIG. 5.

Figure 5:
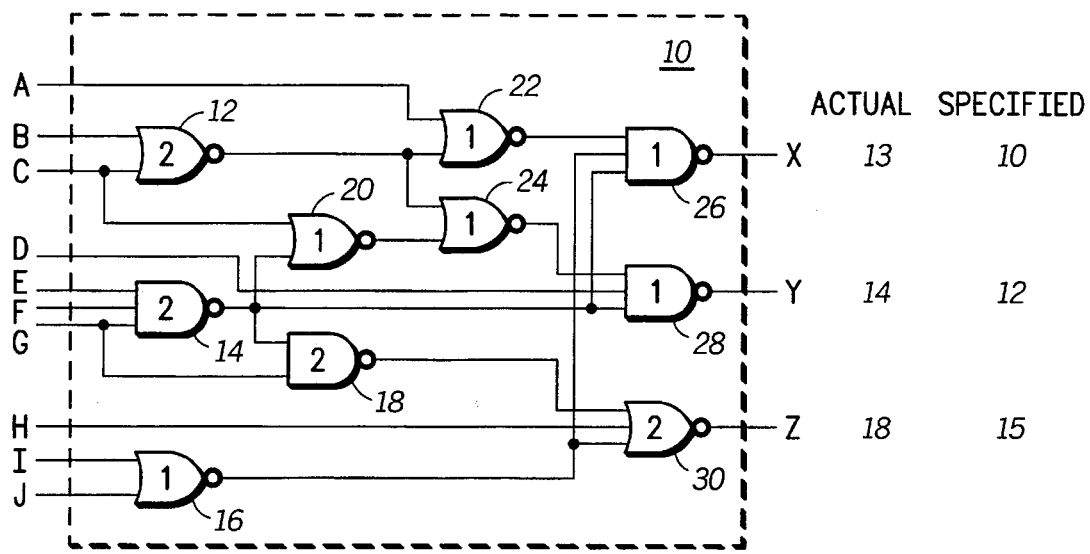
Figure 6:
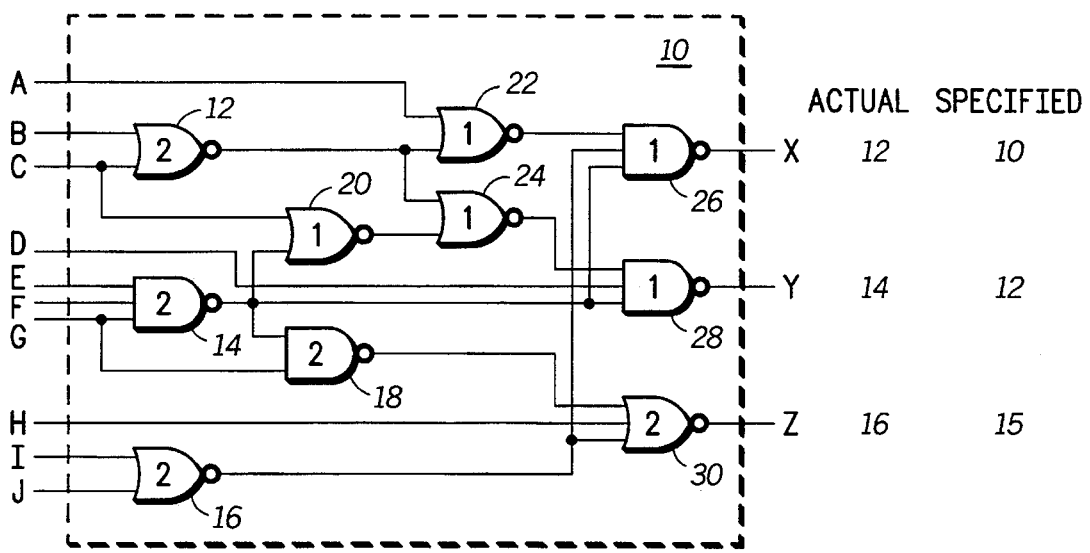

In FIG. 5, either the output X or the output Z is once again the worst case output. In this case, we determine that X is to be used in the fifth iteration as the worst case output where the worst case path is from output X to inputs I or J. The sensitivity calculations taught herein are performed and determine that gate 16 is the best gate to increment in size by reading the next larger size from the memory library of memory-stored logic gates. Therefore, in FIG. 6, gate 16 is incremented from a size 1 to a size 2 gate. In FIG. 6, the incrementing of gate 16 from size 1 to size 2 affects not only the actual time of X, but the actual time of output Z as well.

Figure 7:
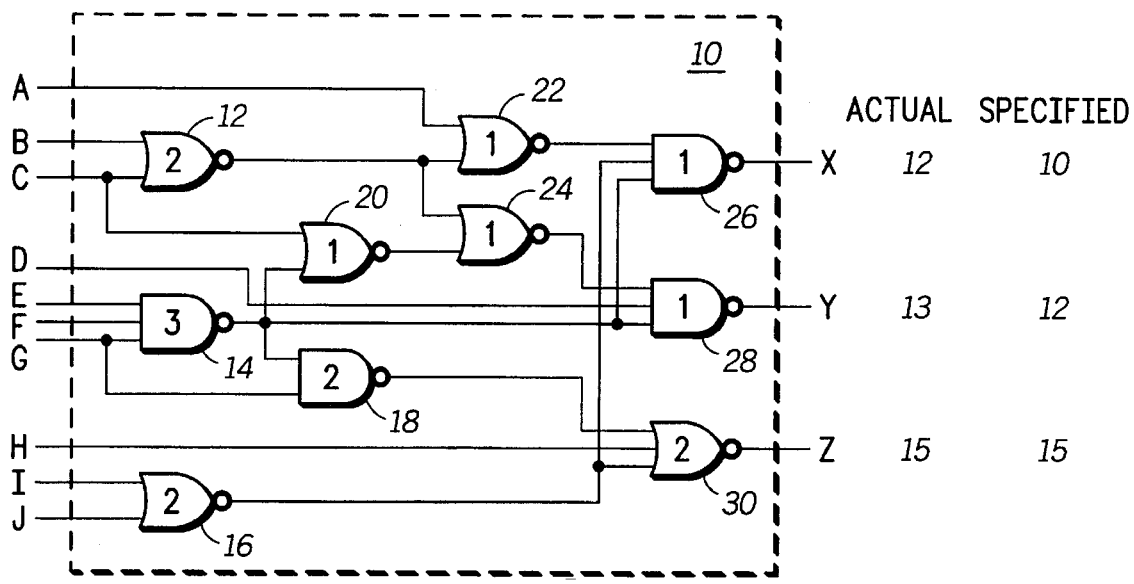

In FIG. 6, either X or Y could be the worst case output. In FIG. 6 we choose Y to the input E, F, and G as being the worst case path with Y being the worst case output. The sensitivity calculations are again performed in this iteration and gate 14 is determined to have the best sensitivity. Gate 14 was previously incremented in size via FIGS. 1 and 2 and now in FIGS. 6 and 7 is incremented from size 2 to size 3 to further reduce circuit speed at the expense of added surface area to gate 14. The differences in actual times are represented in FIG. 7 due to the size increase of gate 14.

Figure 8:
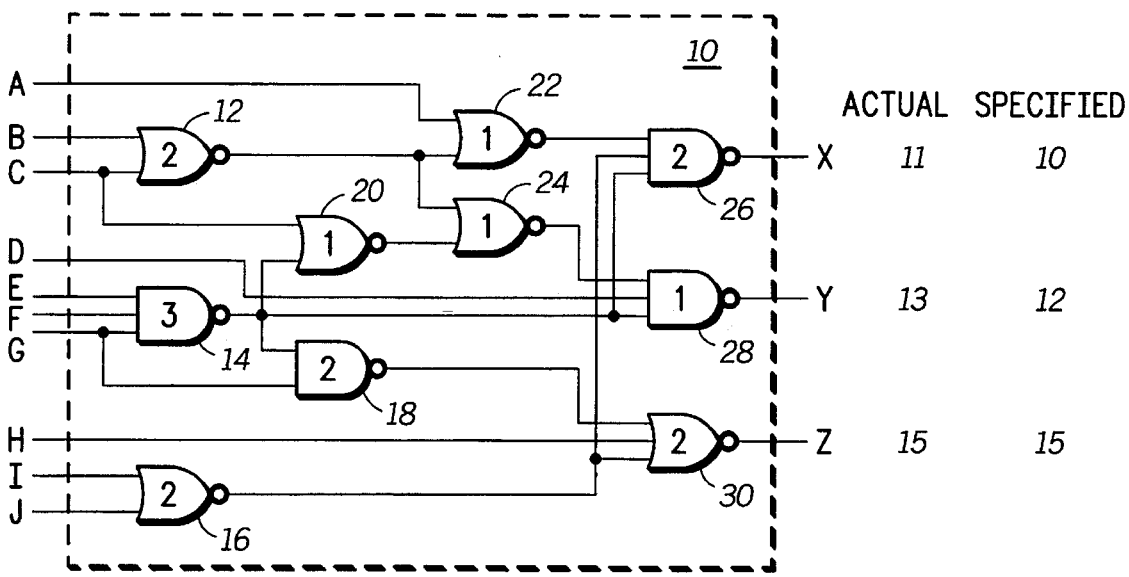

In FIG. 7, the X output is chosen to be the worst case output and the worst case path is from output X to inputs B or C. The sensitivity calculations taught herein identify gate 26 as being the gate with the best sensitivity. Therefore, in FIG. 8, gate 26 is incremented from a size 1 to a size 2. FIG. 8 illustrates that gate 26 has been incremented in size to affect the actual time of the X output and reduce the actual time of the X output from 12 to 11.

Figure 9:
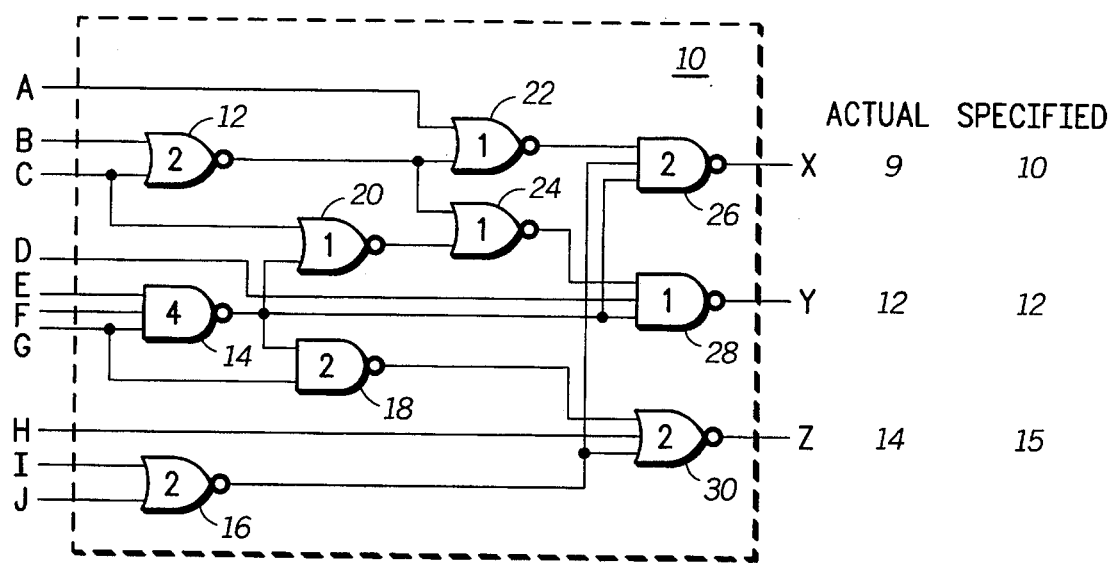

In FIG. 9, it is determined that Y is the worst case output with the worst case path being from E to output Y. It is determined that the gate 14 must once again be incremented from a size 3 to a size 4 in order to reduce the actual time of Y in an efficient manner according to the sensitivity calculations. Therefore, FIG. 9 illustrates that gate 14 is incremented once again by one quantum unit in size from size 3 to size 4. In FIG. 9, it can be seen that all of the actual times are either less than or equal to the specified times for each output X, Y and Z. Therefore, the iterative technique taught herein allows area to be kept at a near optimal minimum value while speed and timing constraints are adhered to. In addition, this iterative technique allows the use of semi-custom design flow gate libraries, which greatly increases time to market and efficiency when designing integrated circuits. By allowing the use of gate libraries, the logic gate sizing technique is greatly improved over the individual custom-flow process of incrementing only transistors.

Figure 10:
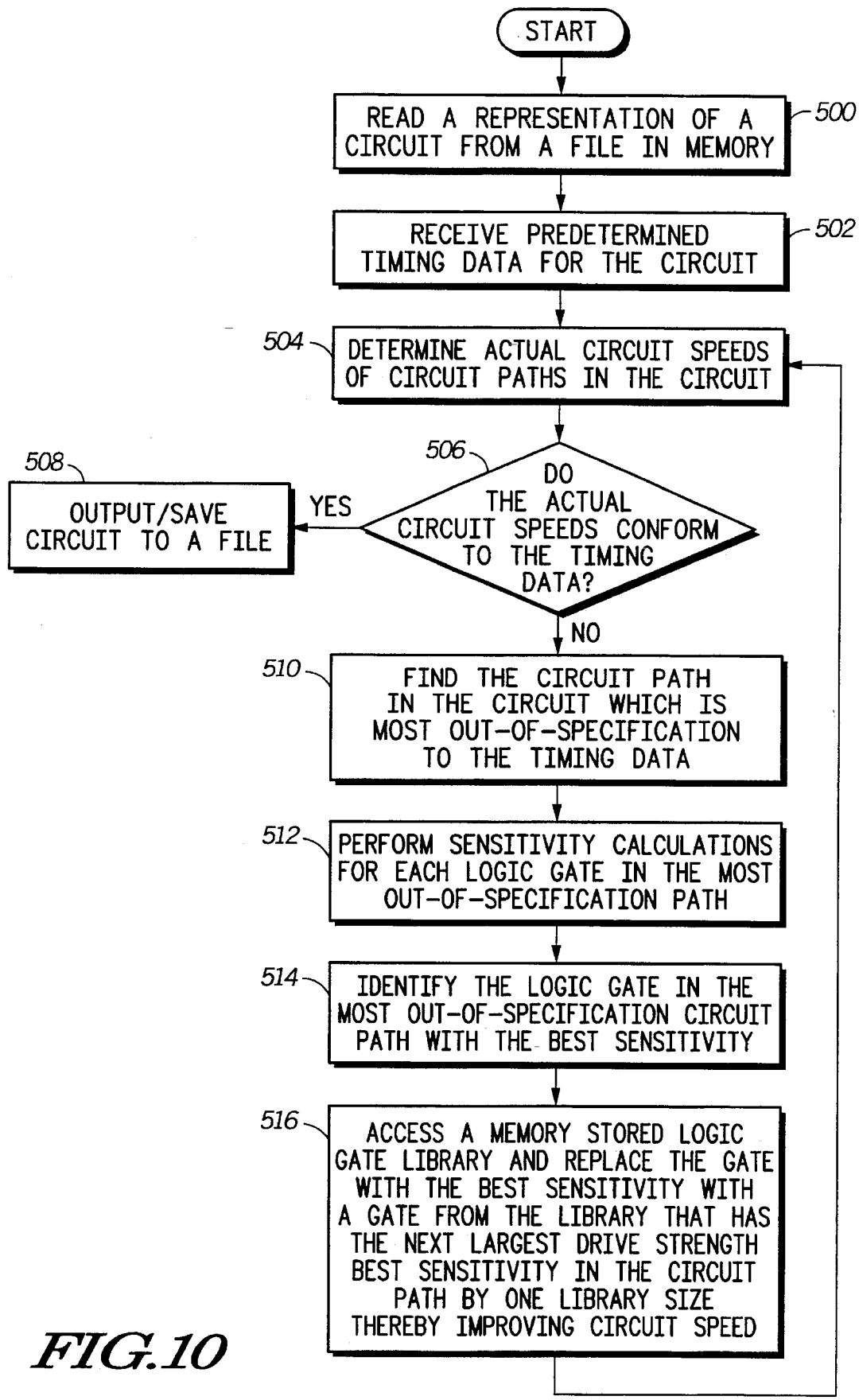
FIG. 10 illustrates, in a flowchart, an iterative method for making a circuit conform to predetermined timing constraints, the method being in accordance with the present invention.

FIG. 10 illustrates a illustration which describes the method taught above in a flowchart form. In a step 500, a behavioral circuit model (BCM) or circuit input file is read from memory. In a step 502, predetermined circuit timing constraints are read received so that the timing limits/requirements of the circuit described by the BCM are identified. In a step 504, the actual circuit delay times of the circuit paths in the BCM are calculated. Circuits identified by the BCM are usually large and cannot be processed all at once. Instead, various cones of logic or logic portions may be analyzed from the BCM in a serial manner until the entire BCM or an entire portion to be optimized is completed.

Typically, a larger circuit can be parsed into smaller circuits using flip-flops, storage elements, memory elements, output pins, input pins, and like elements as cone logic boundaries. Therefore, steps 502–516 may be repeated for several sub-circuits within a larger circuit defined by the BCM.

In a step 506, the actual times calculated from step 504 are compared to the constraints read in step 502. If the actual times are out-of-specification, then the steps 510–516 are performed, else an in-specification output file is saved or circuit size data is saved to memory as cones of logic complete analysis or when the entire BCM is completely optimized (see step 508).

In a step 510, the difference methods, as taught above to find how much out-of-specification a circuit path is between actual timing and specified timing constraints, are used to find a worst case logic path in the circuit under optimization. This worst case path is analyzed in a step 512 to find a gate in the worst case path which has a best sensitivity as taught above (see Eq. 1). The logic gate with the best sensitivity is identified in a step 514. This best sensitivity logic gate is replaced with another gate read from a library of gates in a step 516. This another gate which replaces the gate with the highest sensitivity has a drive strength greater that the gate currently identified in the circuit. By replacing the gate with a gate of greater strength, circuit speed is improved. In most cases, the gate in question is incremented in size from the library by one size. In other words, the gate in question is replaced by a gate in the library with a next larger strength. The looped/iterative steps 504, 506, 510, 512, 514, and 516 are repeated until all circuit paths in the circuit being optimized are within the timing specification read in step 502.

While the present invention has been illustrated and described with reference to specific embodiments, further modifications and improvements will occur to those skilled in the art. For example, more than one gate may be increased in size in each iteration in the process taught herein. Plurality, as used herein, is intended to mean any numerical value X wherein $2 \leq X < \infty$. When plurality is used, plurality should not be taken to mean any specific/particular subrange or constant within $2 \leq X < \infty$ but should be taken to mean any value within the range $2 \leq X < \infty$. Sensitivity of gates and transistors may be calculated in other equivalent manners. It is to be understood, therefore, that this invention is not limited to the particular forms illustrated and that it is intended in the appended claims to cover all modifications that do not depart from the spirit and scope of this invention.

What is claimed is:

1. A method for setting gate strengths within a circuit, the method comprising the steps of:

receiving a circuit description file describing the circuit in terms of at least one input, at least one output, and at least one circuit path between the at least one input and the at least one output, the at least one circuit path comprising a plurality of gates, the strength of each gate in the plurality of gates being set to an initial strength;

receiving predetermined timing data which indicates required circuit speeds of the at least one circuit path;

determining the circuit speed of one path within the at least one circuit path and performing step (*) when the circuit speed of the one path is not in accordance with the required circuit speeds of the at least one circuit path;

(*) determining for every gate affecting the one path, when the circuit speed of the one path is not in accordance with the required circuit speeds of the at least one circuit path, an amount of reduction in circuit path delay ($\Delta S$) in response to an amount of increase in gate area ($\Delta A$) via $\Delta S/\Delta A$ and increasing the size of one gate which has a largest $\Delta S/\Delta A$ ratio and affects the one path; and repeating the steps of determining until the at least one circuit path is in accordance with the predetermined timing data.

2. The method of claim 1 wherein the increasing of the size of the one gate which has the largest $\Delta S/\Delta A$ ratio and affects the one path comprises:

storing a plurality of gates in memory wherein each gate in the plurality of gates stored in memory has a different physical size; and increasing the size of the one gate by selecting a gate from memory which has the same logic function as the one gate but has a larger size.

3. The method of claim 2 wherein the step of increasing the size of the one gate comprises:

selecting a gate from memory which has a same logic function as the one gate but has larger transistor widths so that a drive strength of the gate from memory is greater than a drive strength of the one gate where a greater drive strength improves circuit speed.

4. The method of claim 1 wherein the step of determining for every gate comprises:

calculating $\Delta A$ by choosing a gate from memory which has a larger transistor gate width.

5. The method of claim 1 wherein the step of receiving a circuit description file comprises:

receiving a plurality of circuit paths and selectively optimizing each of the circuit paths in the plurality of circuit paths until all circuit paths in the plurality of circuit paths are in accordance with their respective predetermined timing data.

6. The method of claim 1 wherein the step of determining the circuit speed of one path comprises:

choosing the one path by determining which path in the at least one circuit path has a largest deviation from the predetermined timing data.

7. The method of claim 1 further comprising the step of:

creating an output file after the at least one circuit path is in accordance with the predetermined timing data, the output file describing the circuit which is now in accordance with the predetermined timing data.

8. The method of claim 7 further comprising the step of:

creating integrated circuit masks from the output file wherein the integrated circuit masks are used to form a plurality of integrated circuits via lithographic techniques.

9. The method of claim 7 further comprising the step of:

using the output file to form a plurality of integrated circuits which are in accordance with predetermined timing data.

10. A method for increasing a circuit speed of a circuit path while minimizing circuit area increase along the circuit path, the circuit path being an interconnection of logic gates through a circuit, the method comprising the steps of:

(a) receiving a timing constraint value for the circuit path;

(b) initially setting all sizes of the logic gates in the circuit path to a minimal size;

(c) selecting the circuit path out of a plurality of circuit paths;

(d) determining a speed of the circuit path;

(e) determining, when the speed of the circuit path is not within the timing constraint value, which logic gate in the circuit path is to be replaced by a stronger logic gate from memory where this the logic gate to be replaced is determined by finding the logic gate that maximizes S/A for the circuit path where S is a change in the speed of the circuit path and A is a change in a logic gate area of the logic gate; and (f) repeating steps (c) through (e) until the speed of the circuit path is within the timing constraint value.

11. The method of claim 10 wherein the step (c) comprises:
selecting the circuit path out of the plurality of circuit paths that has a worst-case difference between actual speed and the timing constraint value for the circuit path.

12. The method of claim 10 further comprising the step of:
making integrated circuit masks in accordance with the circuit so that integrated circuits, that operate in a manner substantially similar to the circuit, can be formed on at least one integrated circuit substrate.

13. The method of claim 10 further comprising the step of:
making a plurality of integrated circuits in accordance with the circuit optimized via steps (a)–(f).

14. The method of claim 10 further comprising the step of:
writing an output file containing the circuit wherein the circuit now conforms to the timing constraint value due to the steps (a)–(f).

15. The method of claim 10 wherein the step (e) comprises:
determining which logic gate in the circuit path can be increased in size by summing a plurality of sensitivity values calculated for multiple transistors where the multiple transistors comprise at least a portion of the logic gate.

16. A method for designing a circuit, the method comprising the steps of:
providing a circuit description wherein the circuit described by the circuit description has a plurality of inputs, a plurality of outputs, and a plurality of circuit paths coupling the plurality of inputs to the plurality of outputs through a plurality of logic gates;
setting every logic gate in the circuit to a minimal area;
receiving predetermined timing requirements for the circuit paths;
determining, for each circuit path, a speed of the circuit path;
selecting one circuit path within the plurality of circuit paths which has a worst speed;
increasing a drive strength of one logic gate in the one circuit path to improve the speed of the one circuit path at an expense of circuit area along the one circuit path; and
performing the steps of determining through increasing until all circuit paths in the plurality of circuit paths are within the predetermined timing requirements.

17. The method of claim 16 wherein the step of selecting one circuit path having a worst speed comprises:
performing a subtraction to find difference values between the timing requirements and the speeds of the circuit paths and choosing the circuit path with a greatest difference value as the circuit path with the worst speed.

18. The method of claim 16 wherein the step of increasing the drive strength comprises:
identifying a best logic gate in the circuit path with the worst speed wherein the best logic gate is a logic gate in the circuit path with the worst speed which has a greatest sensitivity; and
replacing the best logic gate with a new logic gate selected from a gate library stored in memory.

19. The method of claim 18 wherein the step of identifying comprises:
finding the greatest sensitivity by finding a sensitivity of each logic gate in the circuit path, each gate in the circuit path comprising a plurality of transistors wherein the sensitivity of each logic gate is a sum of a TILOS sensitivity of each transistor in the logic gate.

20. The method of claim 18 wherein the step of replacing the best logic gate comprises:
replacing the best logic gate with a logic gate having a same logical operation but having a smaller propagation delay.

21. The method of claim 20 wherein the step of replacing the best logic gate comprises:
replacing the best logic gate with the new logic gate such that the replacing results in a plurality of transistors being increased in size when changing from the best logic gate to the new logic gate.

22. The method of claim 16 wherein the step of increasing the drive strength comprises:
replacing the one logic gate in the one circuit path with a logically-equivalent logic gate from a logic gate library, the logically-equivalent logic gate having a greater drive strength than the one logic gate.

23. The method of claim 16 further comprising:
writing circuit information to memory when all circuit paths in the plurality of circuit paths are within the predetermined timing requirements.

24. The method of claim 23 further comprising:
using the circuit information to manufacture a plurality of integrated circuit containing the plurality of circuit paths.

25. A logic gate sizer comprising:
means for receiving a plurality of circuit paths from a circuit description;
means for finding a propagation time for each circuit path in the plurality of circuit paths;
means for receiving timing constraints for each circuit path in the plurality of circuit paths;
means for choosing one circuit path from the plurality of circuit paths which has a largest discrepancy between the propagation time of the one circuit path and the timing constraint for the one circuit path;
means for replacing the one logic gate in the one circuit path with a library-read logic gate having a greater strength than the one logic gate, the library-read logic gate replacing the one logic gate to reduce the propagation time of the one circuit path to a numerical value less than or closer to the timing constraint for the one circuit path; and
means for repeatedly performing the choosing and increasing performed respectively via the means for choosing and the means for increasing until all circuit paths in the plurality of circuit paths are in accordance with the timing constraints.

26. A logic gate sizing processor comprising:
a central processing unit (CPU) for executing computer instructions; and
a memory unit coupled to the CPU for storing the computer instructions, the computer instructions comprising:

computer instructions for receiving a plurality of circuit paths from a circuit description;

computer instructions for finding a propagation time for each circuit path in the plurality of circuit paths;

computer instructions for receiving timing constraints for each circuit path in the plurality of circuit paths;

computer instructions for choosing one circuit path from the plurality of circuit paths which has a largest discrepancy between the propagation time of the one circuit path and the timing constraint for the one circuit path;

computer instructions for replacing the one logic gate in the one circuit path with a library-read logic gate having a greater strength than the one logic gate, the library-read logic gate replacing the one logic gate to reduce the propagation time to a numerical value less than or closer to the timing constraint for the one circuit path; and computer instructions for repeatedly performing the choosing and increasing accomplished respectively via the computer instructions for choosing and the computer instructions for increasing until all circuit paths in the plurality of circuit paths are in accordance with the timing constraints;

where the computer instructions are read from memory and executed by the CPU.

27. Storage media for storing a logic gate sizer, the storage media comprising:

a plurality of binary values for receiving a plurality of circuit paths from a circuit description;

a plurality of binary values for finding a propagation time for each circuit path in the plurality of circuit paths;

a plurality of binary values for receiving timing constraints for each circuit path in the plurality of circuit paths;

a plurality of binary values for choosing one circuit path from the plurality of circuit paths which has a largest discrepancy between the propagation time of the one circuit path and the timing constraint for the one circuit path;

a plurality of binary values for replacing the one logic gate in the one circuit path with a library-read logic gate having a greater strength than the one logic gate, the library-read logic gate replacing the one logic gate to reduce the propagation time to a numerical value less than or closer to the timing constraint for the one circuit path; and a plurality of binary values for repeatedly performing the choosing and increasing accomplished respectively via the plurality of binary values for choosing and the plurality of binary values for increasing until all circuit paths in the plurality of circuit paths are in accordance with the timing constraints.

28. A method for manufacturing an integrated circuit, the method comprising the steps of:

providing a library of logic cells in computer memory, the library containing logic cells which range in size from small sizes to larger sizes;

providing a computer file which contains a plurality of logic gates interconnected by circuit paths such that the computer file defines a design of the integrated circuit;

providing speed-of-operation constraints for the circuit paths;

generating a layout-computer file wherein the logic cells from the library are selected as the logic gates of the computer file, the logic cells being spatially placed across a substrate surface defined in the layout-computer file and interconnected in accordance with the circuit paths, the logic cells selected from the library being of small sizes in order to minimize a total area of the substrate surface area consumed by logic cells in the layout-computer file;

determining if the circuit paths within the layout-computer file are within the speed-of-operation constraints;

changing the size of one or more logic cells used the layout-computer file from the smaller size to a larger size when one or more circuit paths within the layout-computer file are outside of the speed-of-operation constraints, the one or more logic cells being selected for change when: (1) the logic cell affects an operational speed of the one or more circuit paths within the layout-computer file; and (2) the logic cell improves circuit speed while minimizing the increase in total area of the substrate area of the layout-computer file; and manufacturing a plurality of integrated circuit in accordance with the layout-computer file after one or more logic cells in the layout-computer file have been increased in size.

29. A method for manufacturing an integrated circuit, the method comprising the steps of:

(a) providing a design file, the design file containing a circuit path containing a plurality of logic gates;

(b) providing a delay time limit for the circuit path;

(c) determining if the circuit path is within the delay time limit; and (d) finding a selected gate among the plurality of logic gates wherein the selected gate has an optimal speed improvement versus area increase value over all the other plurality of logic gates;

(e) increasing a size of the selected gate;

(f) iteratively performing steps (d) through (f) until the circuit path is within the delay time limit; and (g) manufacturing a plurality of integrated circuits, each integrated circuit in the plurality of integrated circuits having the circuit path.

* * * * *